(12) United States Patent
Terada et al.

(10) Patent No.: US 7,052,151 B2
(45) Date of Patent: May 30, 2006

(54) PHOTOGRAPHY LIGHT SOURCE DEVICE

(75) Inventors: Toshiyuki Terada, Tokyo (JP); Keizo Sekido, Tokyo (JP); Shigekazu Kato, Tokyo (JP); Kimihiro Iritono, Tokyo (JP)

(73) Assignee: Stanley Electric Co., Ltd, Tokyo (JP)

( * ) Notice: Subject to any disclaimer, the term of this patent is extended or adjusted under 35 U.S.C. 154(b) by 85 days.

(21) Appl. No.: 10/662,444

(22) Filed: Sep. 16, 2003

(65) Prior Publication Data
US 2004/0196643 A1 Oct. 7, 2004

(30) Foreign Application Priority Data
Apr. 4, 2003 (JP) .............................. 2003-101756

(51) Int. Cl.
G03B 15/06 (2006.01)

(52) U.S. Cl. ................................ 362/16; 362/3; 362/11

(58) Field of Classification Search .................... 362/3, 362/8, 11, 12, 16, 17, 230, 231, 800, 802, 362/257, 337, 317, 227, 277, 293; 348/370, 348/371; 396/155, 61; 257/89, 90
See application file for complete search history.

(56) References Cited

U.S. PATENT DOCUMENTS

| | | | | |
|---|---|---|---|---|
| 3,611,069 A | * | 10/1971 | Galginaitis et al. | ............ 257/90 |
| 4,666,276 A | * | 5/1987 | Chan | ............ 396/180 |
| 5,287,135 A | * | 2/1994 | Arai et al. | ............ 396/174 |
| 5,313,188 A | * | 5/1994 | Choi et al. | ............ 340/331 |
| 5,617,163 A | * | 4/1997 | Ohtake | ............ 396/176 |
| 5,739,552 A | * | 4/1998 | Kimura et al. | ............ 257/89 |
| 5,895,128 A | * | 4/1999 | Kishimoto et al. | ............ 396/61 |
| 6,179,447 B1 | * | 1/2001 | Ishikawa et al. | ............ 362/277 |
| 6,329,760 B1 | * | 12/2001 | Bebenroth | ............ 315/200 A |
| 6,525,464 B1 | * | 2/2003 | Chin | ............ 313/499 |
| 2002/0025157 A1 | * | 2/2002 | Kawakami | ............ 396/155 |
| 2002/0153835 A1 | * | 10/2002 | Fujiwara et al. | ............ 313/512 |
| 2003/0180037 A1 | * | 9/2003 | Sommers | ............ 396/155 |

* cited by examiner

Primary Examiner—Ali Alavi
Assistant Examiner—Hargobind S. Sawhney
(74) Attorney, Agent, or Firm—Dickstein, Shapiro, Morin & Oshinsky, LLP.

(57) ABSTRACT

Light source devices for photography using LED elements as a light source known in the prior art provide insufficient quantity of light, and the inability to avoid size increases in order to generate a sufficient quantity of light has been problematic. A photography light source device 1 according to the present invention has a light source comprising a plurality of LED elements 2 generating white light or light of the three primaries and arranged in one or more rows parallel with the direction of the longer side of the photograph, a case 3 having a lens on which linear fresnel cuts 3a have been applied in a linear direction parallel to the arrangement direction is mounted on the LED element 2, and upon lighting of the LED element 2, drive is performed with a current of between 3 and 50 times the magnitude of the rated current thereof and a lighting duration of between 10 and 600 msec. Accordingly, the linear fresnel cuts 3a increase the efficiency of illumination by distributing light uniformly over the area of exposure, and in addition, a large current is applied in a pulse type pattern as the drive current, thus solving the problems by allowing sufficient brightness to be achieved with no associated increases in size.

15 Claims, 3 Drawing Sheets

PHOTOGRAPHY LIGHT SOURCE DEVICE

BACKGROUND OF THE INVENTION

1. Field of the Invention

Recent years have seen increasing numbers of mobile phones, mobile computers and other mobile devices featuring integrated digital cameras, and the present invention relates to light source devices attached to these mobile devices as illuminating light sources for use during, for example, nighttime photography or photography in darkened indoor locations.

2. Detailed Description of the Prior Art

In this type of irradiating device using LED elements as the light source known in the prior art, it is preferable for a single LED element for each of three colors—namely, red (R), green (G), and blue (B)—to be mounted inside an indentation formed in a molded interface device (MID), for the light emitted from each of these LED elements to be mixed, and for the corresponding color rendering properties to be freely adjusted. (For example, see Patent Document 1)

Patent Document 1

The Japanese Patent Laid-Open No. 1999-163412 (Paragraph 20 through Paragraph 82, FIG. 1 through FIG. 24)

SUMMARY OF THE INVENTION

The light output from a light source of the configuration known in the prior art as mentioned above with, for example, LED elements comprising a combination of R, G and B elements provides insufficient quantity of light for a photography, and therefore to obtain the required illumination illuminance, it is necessary to increase the number of LED elements used. In such devices using LED elements for each of the three primaries, or as explained in Patent Document 1, LED elements for four colors, it is necessary to increase the number of LED elements in combinations of three (or four) in order to increase the quantity of light, and this is manifested in remarkable increases in the size of the illumination device.

In terms of the present invention, since the illumination device is intended for mounting on mobile phones and other similar compact devices, if priority is given to producing sufficient brightness for a photography and the number of LED elements is set accordingly, the corresponding increase in size leads to difficulty in the actual mounting of the illumination device; conversely, if the priority is given to the number of LED elements that can be installed, the resulting illumination is insufficient and photographs of a satisfactory quality cannot be taken.

As a tangible means of resolving the problems known in the prior art, the present invention is for a photography light source device provided as a light source in a camera integrated into a mobile device, and it is characterized in that its light source device comprises of a plurality of LED elements generating white light or light of the three primaries arranged in one or more rows parallel with the direction of the longer side of the photograph, in that a case having a lens on which linear fresnel cuts have been administered in a linear direction parallel to the arrangement direction is mounted on the LED element, and in that upon lighting of the LED element, drive is performed with a current of between 3 and 50 times the magnitude of the LED element's rated current and a lighting duration of between 10 and 600 msec.

BRIEF DESCRIPTION OF THE DRAWINGS

These and others and advantages of the present invention will become clear from following description with reference to the accompanying drawing, wherein.

REFERENCES

Figure 1:
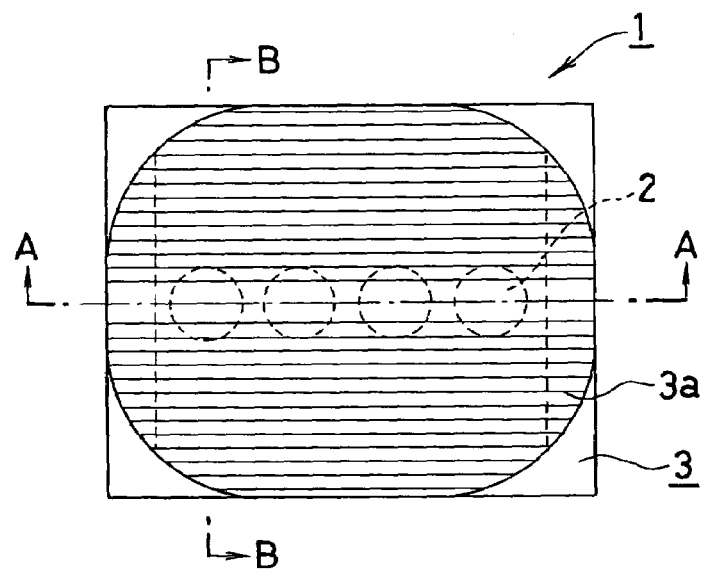
FIG. 1 is a front elevation view showing a photography light source device according to the first embodiment of the present invention.

1: Photography light source device
2: LED element
21: LED chip
22: Transparent resin
23: Fluorophor
3: Case
3a: Linear fresnel cut
3b: Circuit substrate
4: Spring contact piece
5: Glass substrate
5a: Transparent electrode

DETAILED DESCRIPTION OF THE PREFERRED EMBODIMENT

While the presently preferred embodiment of the present invention has been shown and described, it will be understood that the present invention is not limited thereto, and that various changes and modification may be made by those skilled in the art without departing from the scope of the invention as set forth in the appended claims.

Figure 3:
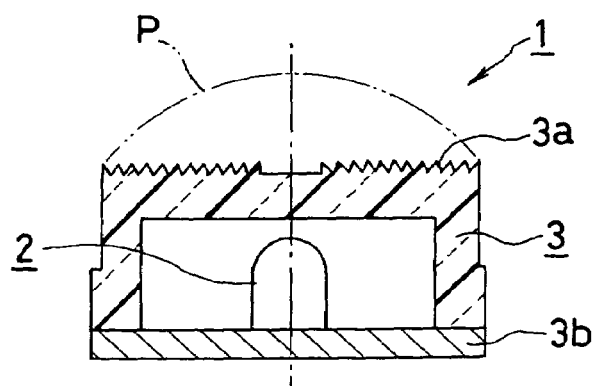
FIG. 3 is a cross-section view on B—B of FIG. 1.

Hereinafter, the present invention will be described by way of preferred embodiments thereof with reference to the accompanying drawings. FIG. 1 FIG. 3 show a photography light source device 1 according to the first embodiment of the present invention, and this photography light source device 1 is provided as a light source of illumination for the camera integrated into a mobile device; furthermore, the mobile device is a compact mobile phone, and consequently, the photography light source device 1 is small and is required, for example, to be contained inside dimensions of 9 mm in width, 9 mm in height, and 3 mm in depth.

The present invention also employs an LED element 2 as the light source for the photography light source device 1; furthermore, an appropriate plurality of LED elements 2 are mounted on, for example, a circuit substrate 3b and are covered by and integrated with a case 3 having a linear fresnel cut 3a in the direction of light emission, and can be assembled into a mobile device using a simple mounting means serving to also provide electrical power as realized by spring contact pieces 4 mounted on, for example, the circuit substrate 3b An appropriate plurality of white-light emitting LED elements 2 are used in the first embodiment. The term "appropriate plurality" as used herein with respect to LED elements 2 refers to a plurality of between one and a number mountable in a mobile device such as a mobile phone without resulting in an increase of size thereof, and in consideration of the dimensions set for the case 3, refers to a number of between four (as shown in the figure) and eight. Furthermore, as shown in FIG. 3, the LED elements 2 are arranged in one or more rows in parallel with the longitudinal direction of the photographs taken by the camera.

Figure 4:
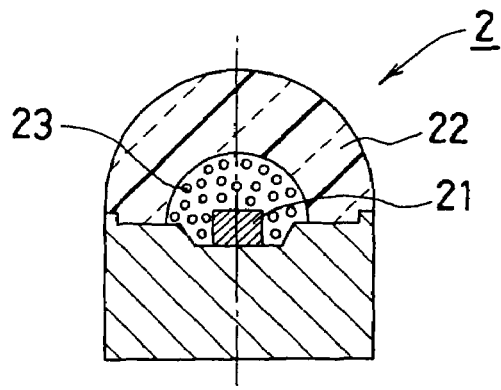
FIG. 4 is a cross-section view showing a typical configuration of an LED element used in the photography light source device according to the present invention.

FIG. 4 shows a typical configuration of a white-light emitting LED element 2 used in the first embodiment, and when a blue-light emitting LED chip 21 is covered in a transparent resin 22 such as epoxy resin and rendered damp-proof, fluorophor 23 are mixed into all or a portion of the transparent resin 22, thus enabling white light to be obtained when the fluorophor 23 are excited by the light emitted from the LED chip 22; furthermore, fluorescent materials generating yellow-colored light and known as YAG and In can be selected for the fluorophor 23, or alternatively, a combination of fluorophor 23 including materials individually emitting the three primaries R (red), G (green) and B (blue) can be selected.

Figure 5:
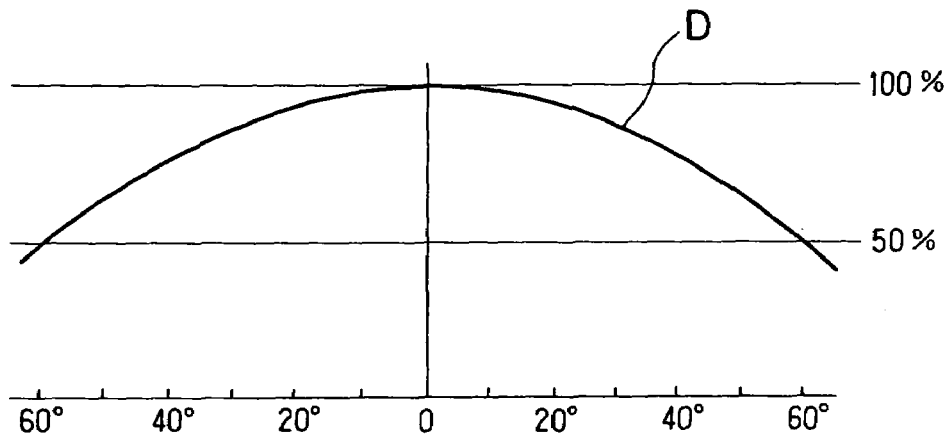
FIG. 5 is a graph showing a typical light distribution characteristic of an LED element.

In either case, the light emitted from the LED chip 21 is incident upon the fluorophor 23, resulting in this light being diffused, and as shown by the light distribution characteristic D in FIG. 5, the angle at which the brightness drops to 50%-or in other words, the half reduction angle—is large at approximately 60° on each side; accordingly, when compared with the coverage angle of approximately 25° on each side as set for this type of photograph, light is diffused over a relatively wide area.

This corresponds to the distribution of the light over an area not required to be exposed in the taking of photographs, or in other words, to a reduction in the volume of light distributed to each unit area required to be used. Furthermore, the light emitted from the LED element 2 is distributed in a beam with a substantially circular distribution shape in the cross-section of a light flux, and since the camera exposes an area with a same rectangular shape, the distribution of light is also mismatched in terms of shape and the level of illumination is further decreased.

In the present invention, in order to cope with the aforementioned problem, a linear fresnel cut 3a is applied on the case 3 as explained above; furthermore, as shown in FIG. 3, a convex lens P is established in a section perpendicular to the longer side of photographs taken by a camera, and a linear fresnel lens is used, which is made when the convex lens P and the cross-section shape on which fresnel cuts have been applied are traced along the case 3 in parallel with a longitudinal direction of the photographs.

In this way, light is made convergent with a half reduction angle of approximately 20° on the shorter side of the photograph and with a half reduction angle of approximately 35° on the longer side of the photograph in the present invention, thus enabling the light from the LED element 2 with a primarily low light emission volume to be made adequately convergent and ensuring efficient distribution of light within the range to be photographed by a camera.

Figure 6:
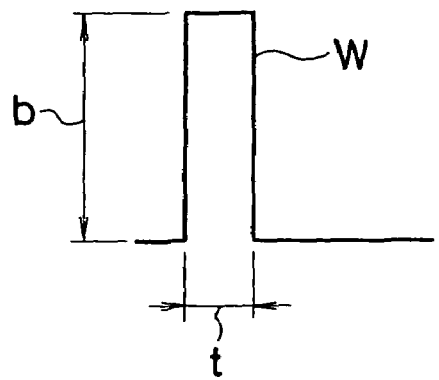
FIG. 6 is a schematic view of a typical drive current for an LED element.

In addition to using the linear fresnel cut 3a as explained above, the present invention also utilizes a method of lighting the LED element 2 with ingenuity. FIG. 6 shows a typical current pattern W applied to the LED element 2, and as a basic shape, this current pattern W features the substantially rectangular shaped single pulse comprising an application time t and a scaling factor b, and in this embodiment, the application time is set at between 10 and 600 ms, and the scaling factor b is set at between 3 and 50 times the rated current. However, the application time t and the scaling factor b have a generally inverse mutual relationship, and it is preferable to set the application time t at a low value when the scaling factor b is set at a large value.

The volume of light emitted from the LED element 2 is substantially proportional to the applied current and, for example, when a current with a scaling factor of 50 is applied, with identical lighting times, it is possible to obtain a level of brightness equivalent to that obtained when the number of LED elements 2 is increased by a factor of 50. In reality, the quantity of light resulting from increased application current exhibits a tendency to become somewhat saturated and it is not possible to accurately obtain the brightness magnified by a factor of 50; accordingly, a suitable degree of correction is required.

In some cases such as a battery is used as a power source in mobile devices such as mobile phones, and since the corresponding power supply voltage is relatively low and the corresponding current capacity is small, as a matter of course, voltages equal to or higher than the power supply voltage will be required in order to generate a current equal to or higher than the rated current in the LED element 2. Furthermore, when it is necessary to generate a current 50 times larger than the rated current in the LED element 2 in order to obtain the required brightness, if the rated current is 20 mA, the required current value for each LED element 2 would be 1 A, and in accordance with the number of LED elements 2 used, situations where the power supply capacity is exceeded can be expected.

Accordingly, it is preferable to provide where necessary in the mobile device, for example, an inverter circuit or some other boosting means to increase the voltage to the required level, and a condenser circuit or some other storage means to store the required power in the boosted voltage until provision thereof to the LED element 2.

When the employed LED element 2 comprises a combination of a blue-light LED chip 21 and fluorophor 23 generating yellow light, although the color of the light emitted overall is certainly white, the red component of this illuminating light is small, the color blue is predominant in photographs of subjects illuminated using the light from the LED element 2, and the observers thereof considerably have a foreign impression as manifested in poor facial coloring and the like. Accordingly, in the present invention, for example, one or more of the four LED elements 2 are red LED elements 2R emitting red-colored light as shown in FIG. 2, and consequently, the generation of red light is corrected and the color rendering properties of the photography light source device 1 are improved so that the development of a foreign impression is prevented.

A method whereby white light is produced by combining an LED chip 21 generating near-ultraviolet light with fluorophor 23 generating the three primaries can be used in the realization of a white-light LED element 2, and when such an item is used as the light source, the three primaries R (red), G (green) and B (blue) are contained in the emitted light, and since therefore there is no need to add red-light LED elements 2R, in terms of the above mentioned example, white-light LED elements 2 can be used for all four LED elements.

Figure 2:
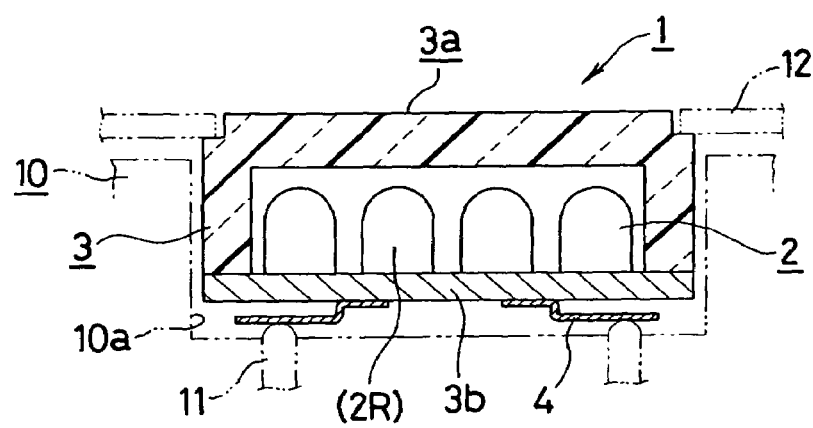
FIG. 2 is a cross-section view on A—A of FIG. 1.

The part indicated by reference 4 in FIG. 2 is a spring contact piece used to provide power to the photography light source device 1, and utilizing the elastic behavior of this spring contact piece 4 when, for example, pressed against a terminal 11 provided in a recess 10a in the mobile device's body 10 by a housing cover 12 during assembly of the photography light source device 1 into the mobile device as shown by the chain double-dashed line, assembly operations are simplified.

By adopting the configuration explained above in accordance with the present invention, when a digital or other camera is assembled into a small mobile device such as a mobile phone, assembly of the photography light source device 1 enabling photography to be carried out at nighttime or in other conditions where the peripheral light is insufficient is made possible without an increase in size of the mobile phone or the like.

Figure 7:
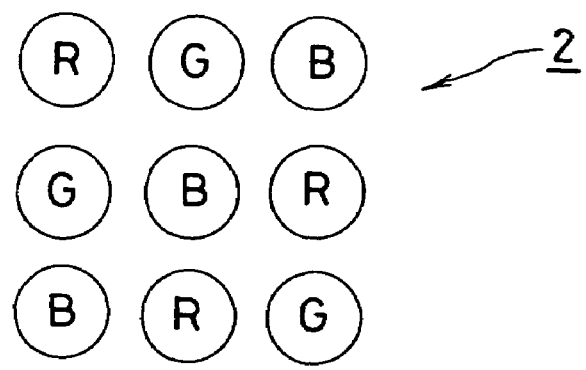
FIG. 7 is a front elevation view showing the disposition of an LED element in a photography light source device according to the second embodiment of the present invention.

FIG. 7 shows the second embodiment of the photography light source device 1 according to the present invention. Although white-light LED elements 2 are used as the light source in the previous embodiment, when the image being photographed is a color image, and even when fluorophor generating the three primaries are used, the color temperature of white light is fixed and the quality thereof is not considered to be particularly high; accordingly, differences can develop between the coloring of images photographed under natural light and images photographed using the photography light source device 1 as the source of illumination, and users have a foreign.

In this embodiment, a red LED element 2R generating red light, a green LED element 2G generating green light, and a blue LED element 2B generating blue light are combined as an LED element 2 generating the three primaries, and the mixture ratio of the colors is adjusted within the range of so-called white light to adjust the color temperature of the illuminating light and to achieve the same coloring as characteristic of photography under natural light.

The results of prototype manufacture, testings, and evaluations by the inventors confirmed that the light emitted by the LED element 2 is characteristic of light emitted from a single point with relatively strong directional characteristics, and therefore, when three LED elements 2 are combined in accordance with this embodiment, there is insufficient mixing of colors, and this has led to phenomena such as one half of a photographed face having a red hue and the opposing half having a blue hue.

In this embodiment, therefore, LED elements 2 (R, G, and B) generating the three primaries are disposed in a matrix arrangement in order to further improve the mixing of colors; furthermore, the number of disposed rows and columns is set to the number of colors—namely, no less than three—and the three different colors are disposed in each row and column. Note that the lens 4 and other parts have been omitted from FIG. 7 in order to allow the condition of disposition of the LED elements 2 (R, G, and B) of each color to be clearly indicated.

Accordingly, the setting of a color temperature for the primary colors is made variable by adjusting the magnitude of the current provided to the LED elements 2 (R, G, and B) of each color, and for example, when the color temperature is set at a value close to that of natural light at between 5,000 and 6,000 Kelvin, the difference in coloring with respect to photographs taken under natural light during the daytime can be reduced and development of a foreign feeling can be prevented; furthermore, the characteristics of mixing of the three primaries are improved, and a color leakage and other similar phenomena are eliminated.

Figure 8:
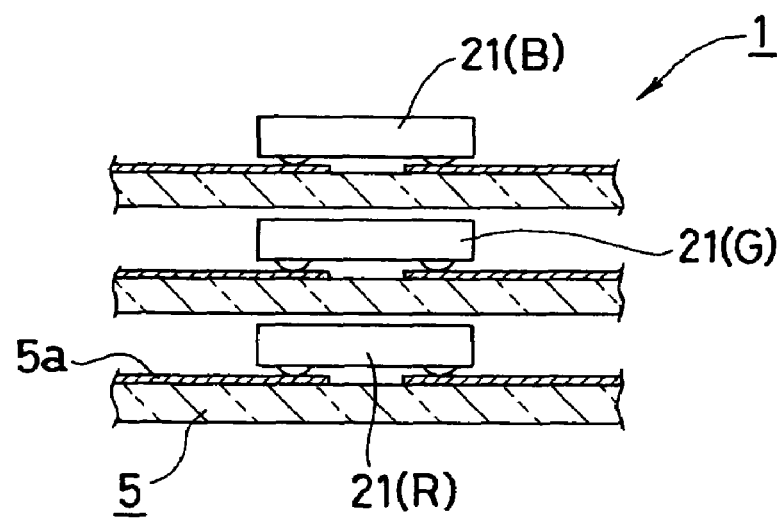
FIG. 8 is a cross-section view of the substantial parts of a photography light source device according to the third embodiment of the present invention.

FIG. 8 shows the third embodiment of the present invention, and even in the second embodiment explained above, close inspection reveals that the light generation positions for R, G and B are mutually independent and it is undeniable that a color leakage could possibly occur when, for example, in extremely close proximity to the photographic subject. In this third embodiment, therefore, the fact that the LED chip 21 itself is transparent is utilized and color drift is prevented.

Accordingly, LED chips 21 (R, G, and B) of each color are, for example, formed into a prescribed shape such as a Philips chip type having positive and negative electrodes on a single side, and each chip is mounted on a glass substrate 5 having a transparent electrode 5a; furthermore, the LED chips 21 (R, G, and B) mounted on the substrate are stacked in the direction of light emission from the photography light source device 1.

Stacking should be carried out in such a way that the LED chips 21 with high light generation efficiencies are disposed on the bottom layers, and it is common for the stacking sequence to be red, green and blue from the bottom layer. Accordingly, light from the LED chip 21R on the lowermost layer is transmitted through the LED chip 21G and the LED chip 21B and is emitted in the illumination direction; furthermore, light generated by LED chip 21G is transmitted through LED chip 21B.

In this way, the LED chips 21 (R, G, and B) become equivalent to a one-point light source, or in other words, the light emitted from the LED chip 21 on the uppermost layer is a white light comprising an R, G, and B mixture, and regardless of the degree of proximity to the photographic subject, no unevenness of color will occur upon an illumination.

In accordance with the present invention as explained above, a photography light source device provided as a light source in a camera integrated into a mobile device is characterized in that its light source comprises of a plurality of LED elements generating white light or light of the three primaries arranged in one or more rows parallel with the direction of the longer side of the photograph, a case having a lens on which linear fresnel cuts have been applied in a linear direction parallel to the arrangement direction is mounted on the LED element, and upon lighting of the LED element, drive is performed with a current of between 3 and 50 times the magnitude of the LED element's rated current and a lighting duration of between 50 and 600 msec; accordingly, a small number of LED elements can provide sufficient illumination in the area of exposure of a digital camera integrated into this type of mobile device, benefits in terms of size, reliability and cost are also made possible by utilizing the LED elements, and therefore, exceptional results are achieved with regard to increased merchantability of mobile devices with integrated cameras such as mobile phones.

What is claimed is:

1. A photography light source device provided as a light source of a camera included in a mobile device, comprising a light source of said photography light source device composed of a plurality of white-light LED elements having a combination of an LED generating blue light and fluorophor converting blue light to yellow light or a combination of an LED element generating near-ultraviolet light and fluorophor converting near-ultraviolet light to three primaries red, green, and blue and arranged in a row parallel with the longitudinal direction of the photograph, and a case having a convex lens on which linear Fresnel cuts are applied in a linear direction parallel to said arrangement direction mounted on said LED element; characterized in that upon lighting of said LED element, a drive performed with a current of between 3 and 50 times the rated current of said LED element and a lighting duration of between 10 and 600 msec, makes light convergent with a half reduction angle of approximately 20° on the shorter side of the photograph and with a half reduction angle of approximately 35° on the longer side of the photograph.

2. The photography light source device of claim 1, said white-light LED element is realized using an LED element generating blue light and fluorophor converting blue light to yellow light, and one or more LED elements generating red light is included in said light source.

3. The photography light source device of claim 2, wherein the device is disposed in a mobile telephone.

4. The photography light source device of claim 1 or 2, wherein
electrical contact between said case and said mobile device is realized using a spring contact piece.

5. The photography light source device of claim 1, wherein said light source is realized using LED elements generating the three primaries red, green, and blue and arranged in a matrix arrangement having a number of rows and a number of columns equal to at least the number of primary colors.

6. The photography light source device of claim 5, wherein the device is disposed in a mobile telephone.

7. The photography light source device of claim 1, wherein
said light source is realized using LED elements generating the three primaries red, green, and blue and arranged in a stacked arrangement of said LED element facing in the direction of the illumination axis of said photography light source device.

8. The photography light source device of claim 7, wherein the device is disposed in a mobile telephone.

9. The photography light source device of claim 1, having 4 to 8 white-light LED elements.

10. The photography light source device of claim 1, further comprising a voltage booster.

11. The photography light source device of claim 10, wherein the voltage booster comprises an inverter circuit.

12. The photography light source device of claim 1, wherein the plurality of white-light LED elements are disposed in a matrix of rows and columns and the three primaries red, green and blue are disposed in each row and column.

13. The photography light source device of claim 1, wherein the device is disposed in a mobile telephone.

14. The photography light source device of claim 13, further comprising a voltage booster.

15. The photography light source device of claim 14, wherein the voltage booster comprises an inverter circuit.

* * * * *